(12) United States Patent
Park et al.

(10) Patent No.: US 10,971,362 B2
(45) Date of Patent: Apr. 6, 2021

(54) EXTREME ULTRAVIOLET PATTERNING PROCESS WITH RESIST HARDENING

(71) Applicant: International Business Machines Corporation, Armonk, NY (US)

(72) Inventors: Chanro Park, Clifton Park, NY (US); Ruilong Xie, Niskayuna, NY (US); Kangguo Cheng, Schenectady, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 16/287,107

(22) Filed: Feb. 27, 2019

(65) Prior Publication Data
US 2020/0273704 A1    Aug. 27, 2020

(51) Int. Cl.
*H01L 21/033* (2006.01)
*H01L 21/027* (2006.01)
(Continued)

(52) U.S. Cl.
CPC ...... *H01L 21/0337* (2013.01); *G03F 7/70033* (2013.01); *H01L 21/0274* (2013.01);
(Continued)

(58) Field of Classification Search
CPC combination set(s) only.
See application file for complete search history.

(56) References Cited

U.S. PATENT DOCUMENTS 8,470,711 B2   6/2013  Arnold et al.
8,883,374 B2   11/2014 Altamirano Sanchez
(Continued)

FOREIGN PATENT DOCUMENTS

KR    20060038597    5/2006

OTHER PUBLICATIONS

Khusnatdinov et al., "Development of a robust reverse tone pattern transfer process." In Advances in Patterning Materials and Processes XXXIV, vol. 10146, pp. 101461A-1 to 12. International Society for Optics and Photonics 2017.
(Continued)

*Primary Examiner* — Mark W Tornow
*Assistant Examiner* — Priya M Rampersaud
(74) *Attorney, Agent, or Firm* — Fleit Intellectual Property Law; Thomas S. Grzesik

(57) ABSTRACT

A photolithography patterning stack and method for forming the same. The stack includes a plurality of patterned silicon oxide lines. A plurality of patterned silicon germanium lines each underlie and contact one patterned silicon oxide line of the plurality of patterned silicon oxide lines. The photolithography patterning stack further comprises a plurality of layers underlying the plurality of patterning silicon germanium lines. The method includes patterning at least a photoresist layer of a photolithographic patterning stack. The patterning exposing portions of a silicon germanium layer of the photolithographic patterning stack. A germanium oxide layer is formed in contact with the patterned photoresist layer and the portions of the silicon germanium layer. A plurality of silicon oxide layers is formed from the germanium oxide layer. Each of the silicon oxide layer is in contact with one of the portions of the silicon germanium layer.

7 Claims, 11 Drawing Sheets

(51) Int. Cl.
  *G03F 7/20* (2006.01)
  *H01L 21/308* (2006.01)
(52) U.S. Cl.
  CPC ...... *H01L 21/0332* (2013.01); *H01L 21/3081* (2013.01); *H01L 21/3086* (2013.01)

(56) References Cited

U.S. PATENT DOCUMENTS

| | | | |
|---|---|---|---|
| 2010/0040838 A1 | 2/2010 | Abdallah et al. | |
| 2015/0132965 A1 | 5/2015 | deVilliers et al. | |
| 2017/0140921 A1 | 5/2017 | Khusnatdinov et al. | |
| 2018/0308687 A1* | 10/2018 | Smith | C23C 16/04 |
| 2019/0165185 A1* | 5/2019 | Chang | H01L 21/28238 |
| 2019/0385902 A1* | 12/2019 | Wang | H01L 21/3086 |
| 2020/0075319 A1* | 3/2020 | Chang | H01L 21/0275 |
| 2020/0091319 A1* | 3/2020 | Bao | H01L 29/66795 |
| 2020/0168507 A1* | 5/2020 | Chang | H01L 21/823418 |

OTHER PUBLICATIONS

Sakaida et al., "Development of silicon glass for etch reverse layer (SiGERL) materials and BARCs for double patterning process." In Lithography Asia 2009, vol. 7520, pp. 75201F-1 to 8. International Society for Optics and Photonics 2009.

Xiang et al., "Introduction of pre-etch deposition techniques in EUV patterning." In Advanced Etch Technology for Nanopatterning VII, vol. 10589, pp. 105890K-1 to 12. International Society for Optics and Photonics 2018.

Anonymous, "functionless Vertical CMOS Transistor with dual channel combining SiGe and III-V", IP.com No. IPCOM000253499D Apr. 4, 2018.

Joseph et al., "Etch hard mask replenishment using thermal oxidation", 2018.

* cited by examiner

EXTREME ULTRAVIOLET PATTERNING PROCESS WITH RESIST HARDENING

BACKGROUND OF THE INVENTION

The present disclosure generally relates to the field of semiconductors, and more particularly relates to photolithography of semiconductor structures.

Ultraviolet (UV) radiation may be employed in photolithography to transfer a pattern onto an article to be processed such as a semiconductor wafer. As semiconductor devices continue to be reduced in scale, shorter wavelengths of radiation are preferred. As a result, techniques have been developed in which extreme ultraviolet (EUV) radiation can be used in the fabrication of semiconductor devices to form components and/or patterns at even smaller scales than more conventional UV photolithography allows. For example, EUV photolithography enables features with dimensions in the order of 320 nanometers (nm) or smaller. EUV radiation is often regarded as including wavelengths of from about 4 nm to about 40 nm. Although patterned feature dimensions have decreased the difficulty in achieving these smaller dimensions has increased. For example, multilayer lithography stacks typically utilized with EUV photolithography may cause defects in the patterned photoresist as devices become smaller and smaller. These defects include broken photoresist lines and microbridging, which can lead to device failures and decreased device performance.

SUMMARY OF THE INVENTION

In one embodiment, a method for forming a photolithographic patterning structure is disclosed. The method comprises patterning at least a photoresist layer of a photolithographic patterning stack. The patterning exposing portions of a silicon germanium layer of the photolithographic patterning stack. A germanium oxide layer is formed in contact with the patterned photoresist layer and the portions of the silicon germanium layer. A plurality of silicon oxide layers is formed from the germanium oxide layer. Each of the silicon oxide layers is in contact with one of the portions of the silicon germanium layer.

In another embodiment, a photolithography patterning stack is disclosed. The photolithography patterning stack comprises a plurality of patterned silicon oxide lines. A plurality of patterned silicon germanium lines each underlie and contact one patterned silicon oxide line of the plurality of patterned silicon oxide lines. The photolithography patterning stack further comprises a plurality of layers underlying the plurality of patterning silicon germanium lines.

In a further embodiment, a semiconductor device structure is disclosed. The semiconductor device structure comprises at least a substrate and a photolithography patterning stack. The photolithography patterning stack comprises a plurality of patterned silicon oxide lines. A plurality of patterned silicon germanium lines each underlie and contact one patterned silicon oxide line of the plurality of patterned silicon oxide lines. The photolithography patterning stack further comprises a plurality of layers underlying the plurality of patterning silicon germanium lines.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
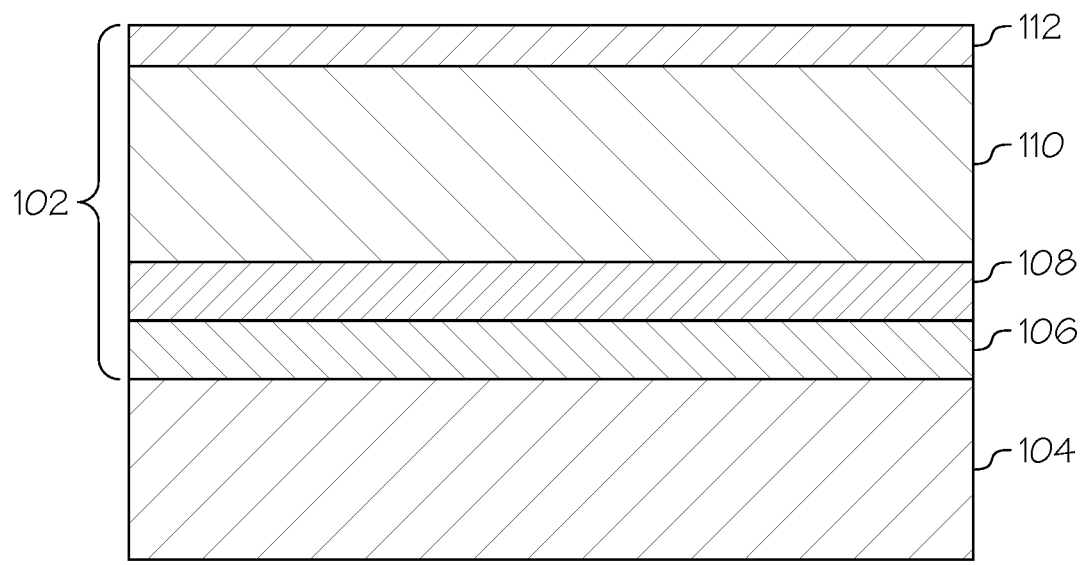
FIG. 1 is a cross-sectional view of one example of photolithographic patterning stack according to one embodiment of the present invention.

It is to be understood that the present disclosure will be described in terms of a given illustrative architecture; however, other architectures, structures, substrate materials, process features, and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip that may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Patterning yield of sub 32 nm pitch by EUV has been found to be extremely challenging due to low resist etch selectivity. Resist erosion during the descumming process further deteriorates the patterning margin. For example, insufficient descumming prevents etching of under layer which leads to open lines. Also, aggressive descumming results in excess EUV resist erosion which leaves insufficient EUV resist for opening the underlying layer. As will be discussed in greater detail below, embodiments of the present invention overcome these problems by enabling patterning of sub 32 nm features with improved processing window and reliability. For example, one or more embodiments, utilize silicon germanium (SiGe) as part of the hardmask. At least part of the SiGe on top of the organic planarization layer (OPL) is selectively converted to silicon dioxide ($SiO_2$) by conformally depositing germanium dioxide ($GeO_2$) on descummed EUV pattern. The $GeO_2$ reacts with the underlying SiGe to form uniform $SiO_2$. Unreacted $GeO_2$ and resist are removed selective to $SiO_2$. The uniform $SiO_2$ may then be used as the mask layer to pattern the SiGe layer. The SiGe layer may then be used to pattern the underlying layer.

FIGS. 1-10 illustrate various processes and structures for managing defects in EUV patterning stacks and improving EUV patterning processes. FIG. 1 shows one example of an initial photolithography stack 102 applicable to one or more embodiments of the present invention. Photolithography patterning stacks are utilized by photolithography processes to transfer a defined pattern(s) to one or more underlying layers of a semiconductor device. In the example shown in FIG. 1, the patterning stack 102 is formed on and in contact with a substrate 104. However, embodiments of the present invention are not limited to patterning stacks formed on a substrate as they may be formed on other patterning stacks, semiconductor features, other layers of the semiconductor device, and/or the like.

The patterning stack 102, in this example, may comprise multiple layers of hardmask materials 106 to 108 formed on top and in contact with one another. Examples of hardmask materials include, but are not limited to, nitrides 106, tetraethyl orthosilicate (TEOS) 108, an organic planarization layer (OPL) 110, amorphous carbon, and/or the like. It should be noted that layer 108 may be any oxide such as atomic layer deposited $SiO_2$, silane oxide, etc.

Nitrides may include titanium nitride (TiN), tantalum nitride (TaN), tungsten nitride (TaN), and/or the like. The nitride layer 106 may be deposited by, for example, physical vapor deposition (PVD) or another suitable process. A TEOS based layer 108 may be formed in contact with the nitride layer 106. For example, an oxide derived from TEOS may be formed on and in contact with the nitride layer 106 using a TEOS-based deposition method. Alternatively, an ALD silicon oxide, or a silicon oxide deposited from silane source, may be deposited on top of nitride layer 106.

The OPL 110 may include a material such as spin-on carbon (SOC), diamond-like carbon, polyarylene ether, polyimide, polymethyl methacrylate, polymethylisopropenyl ketone, photoresists, and/or the like. The OPL 108 may be formed utilizing any conventional deposition process including, for example, CVD, PVD, plasma enhanced chemical vapor deposition (PECVD), evaporation, spin coating, and dip coating. Chemical mechanical planarization (CMP) and/or grinding can be used to planarize the deposited OPL.

Other layers that may be included within the patterning stack include a silicon-containing anti-reflective coating (SiARC) layer; a titanium-ARC; silicon substrates such as silicon dioxide ($SiO_2$), silicon oxynitride (SiON), silicon nitride (SiN), silicon oxycarbide (SiOC)), amorphous silicon (a-Si), a metal oxide layer such as titanium dioxide ($TiO_2$), a titanium-ARC, and/or the like; or any other hardmask layer suitable for an EUV patterning stack.

In one embodiment, the patterning stack 102 also comprises a SiGe layer 112 formed on and in contact with a top layer of the underlying stack. In the example shown in FIG. 1, the SiGe layer 112 is formed on and in contact with the OPL 110. The SiGe layer may be formed/deposited by LPCVD (Low Pressure CVD) to a thickness of, for example, 5 nm to 30 nm (although other thickness are applicable as well). The SiGe layer 112 may be planarized after the SiGe material has been formed/deposited. It should be noted that embodiments of the present invention are not limited to the number of layers underlying the SiGe layer 112 or the materials comprising the layers shown in FIG. 1 as embodiments are applicable to any patterning stack used for EUV photolithography that implements one or more hardmask layers.

Figure 2:
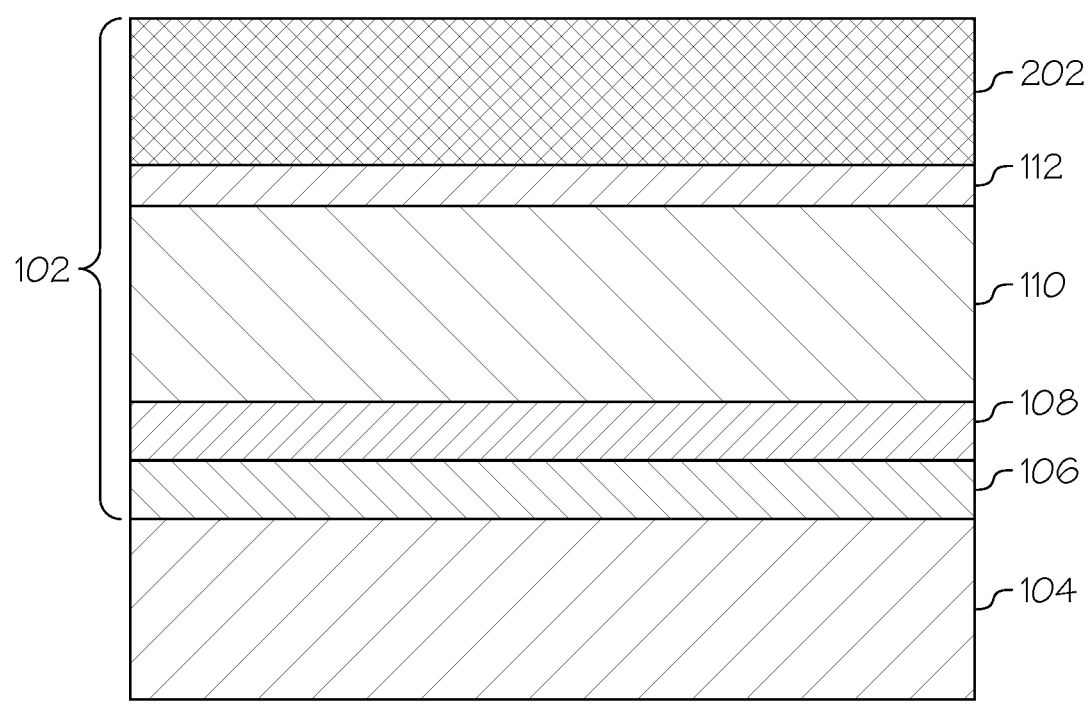
FIG. 2 is a cross-sectional view the photolithographic patterning stack after a photoresist layer has been formed in contact with the top layer of the underlying stack according to one embodiment of the present invention.

FIG. 2 shows that after the patterning stack 102 including the SiGe layer 112 has been formed, one or more photoresist layers 202 are formed on and in contact with the SiGe layer 112. The photoresist layer 202 may comprise a material that is sensitive to one or more types of radiation such as EUV light. The photoresist may be a copolymer of multiple monomers such as poly hydroxy styrene, poly acrylate, (monomers will have an acid labile protecting group) that also comprises photoacid in its composition. Upon exposure to acid the monomers may undergo acid catalyzed deprotection that enable solubility switching when developed in an aqueous base developer. It should be noted that in comes embodiments, an optional organic adhesion layer (OAL) not shown may be formed on and in contact with SiGe layer 112 prior to the formation/deposition of the photoresist layer 202. In this example, the photoresist layer 202 may be formed on and in contact with the OAL layer. The OAL provides resist adhesion and may include an organic bottom anti-reflective coating (BARC) material or other applicable material. The OAL may be formed using a spin-coating technique or any other applicable technique.

Figure 3:
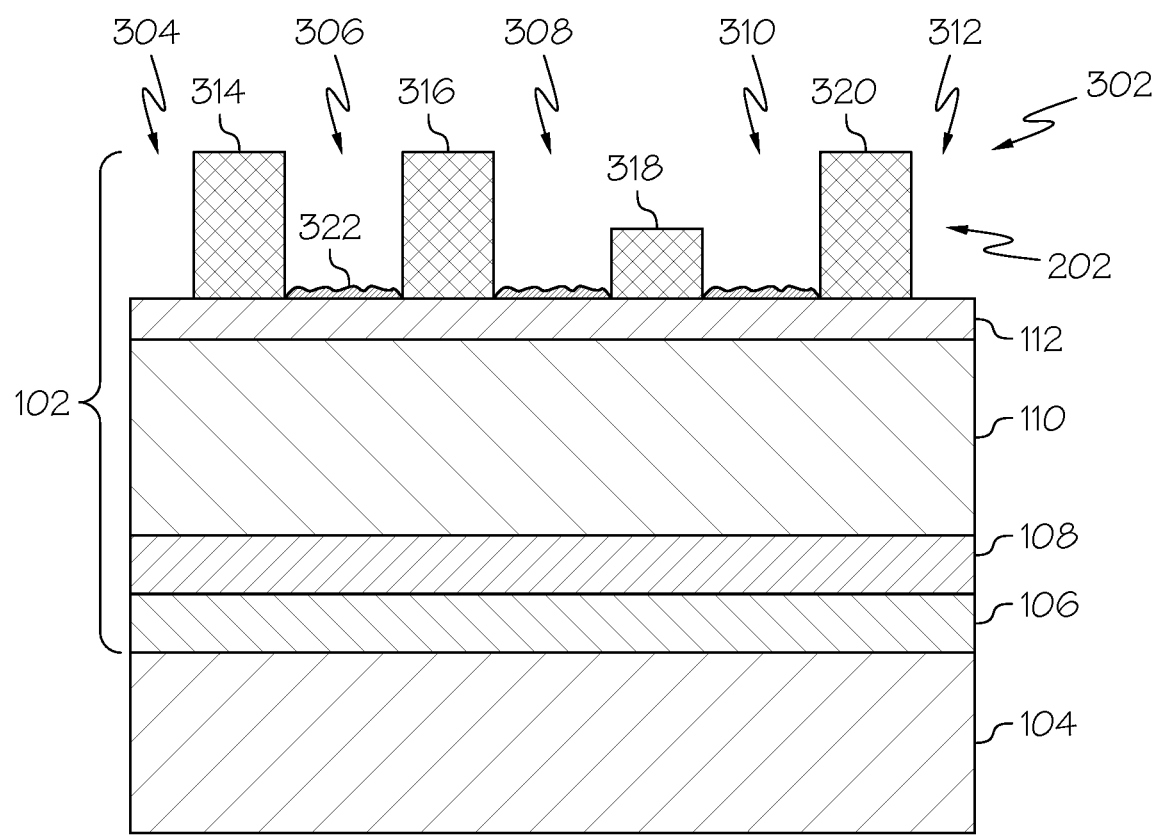
FIG. 3 is a cross-sectional view of the photolithographic patterning stack after a photoresist layer has been patterned according to one embodiment of the present invention.

A desired pattern may then be transferred to the photoresist layer 202, as shown in FIG. 3. In the example shown in FIG. 3 an initial pattern 302 was transferred to the photoresist layer 202 such that portions of the photoresist layer were removed to form trenches 304 to 312 between and/or next to portions of the photoresist layer 202. The photoresist layer 202 may be patterned using any suitable photolithography technique such as EUV. For example, in one embodiment, a photomask (not shown) is disposed over the photoresist layer 202. The photoresist layer 202 is then exposed to a radiation beam, and then hardened via a curing or baking process. Unexposed or exposed portions of the photoresist layer 202 may then be removed using a developer. The foregoing process results in the pattern 302 of "lines" 314 to 320 across the stack 102. The pattern 302 includes portions of the photoresist layer 202 in contact the underlying layer, which in this example is the SiGe layer 112, with openings/trenches 304 to 312 between and/or next to these portions exposing portions of the SiGe layer 112. If the optional OAL layer is utilized, the pattern 302 includes portions of the photoresist layer 202 in contact the OAL layer with openings/trenches between these portions exposing the OAL layer (and possibly any additional underlayers).

As discussed above, the nature of the photoresist patterning process may result in non-continuous patterned lines referred to as "line breaks" of the photoresist. In addition, patterning of the photoresist layer 202 may also result in photoresist residue/scum remaining at the resist/hardmask interface or the resist/OAL interface. For example, FIG. 3 shows resist residue/scum 322 remaining in the trenches 304 to 312 on the surface of the underlying portions of the SiGe layer 112. The resist/scum 322 may be transferred to the underlying layers (including the substrate) causing microbridge or bridge defects that manifest as single line opens after metallization. FIG. 3 also shows that at least one of the patterned lines 318 is notched. The notched line 318 is referred to as a line break since it is an area within the patterned photoresist lines 314 to 320 with non-continuous or reduced photoresist material.

Figure 4:
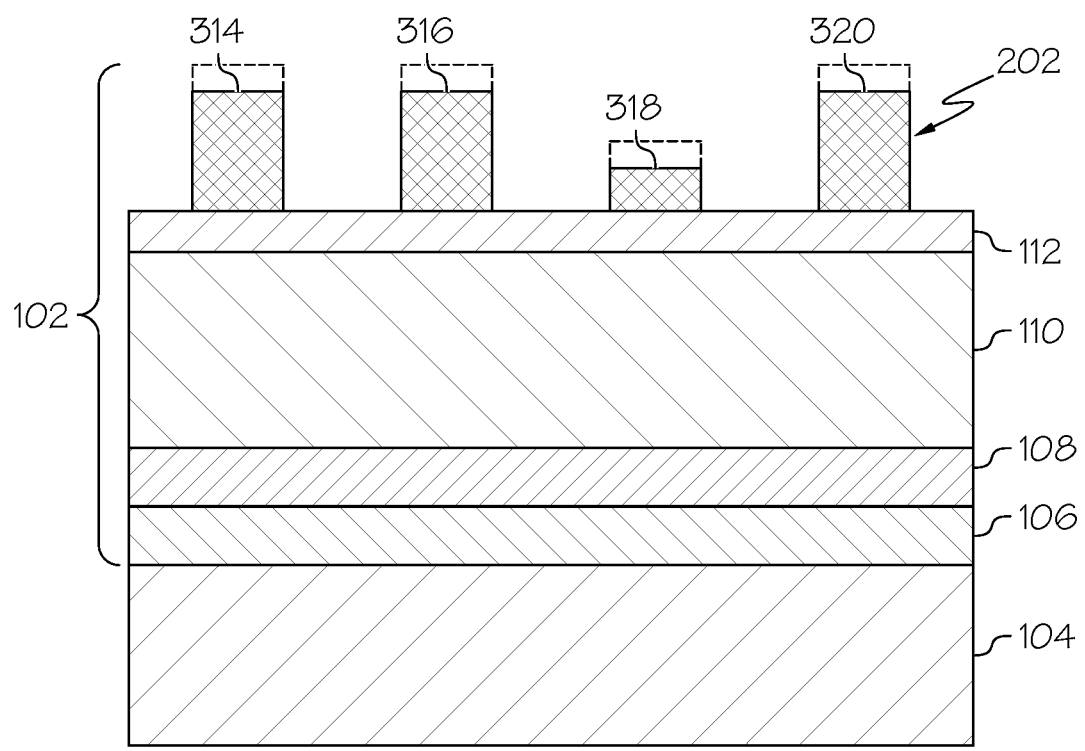
FIG. 4 is a cross-sectional view of the photolithographic patterning stack after a photoresist residue has been removed from patterned trenches according to one embodiment of the present invention.

Therefore, after the photoresist layer 202 has been patterned using a process such as single exposure EUV lithography a descumming process is performed to remove residual resist material from the trenches 304 to 312, as shown in FIG. 4. Descumming is a surface treatment process that removes organic material from a surface. In some embodiments, the descumming process may utilize oxygen plasma ashing to remove the residual photoresist from the underlying portions of the SiGe layer 112. Other chemistries such as HBr/O2, $CO_2/CH_4$, $CF_4$, and/or the like may also be used to remove the remove residual resist material as well. After the descumming process, the semiconductor device comprising the patterning stack 102 may then subjected to a resist hard bake process to further solidify and/or stabilize the patterned photoresist lines 314 to 320. The hard bake temperature may range, for example, from 150° C. to 300° C. The patterning/descumming processes expose underlying portions of the SiGe layer 112.

Figure 5:
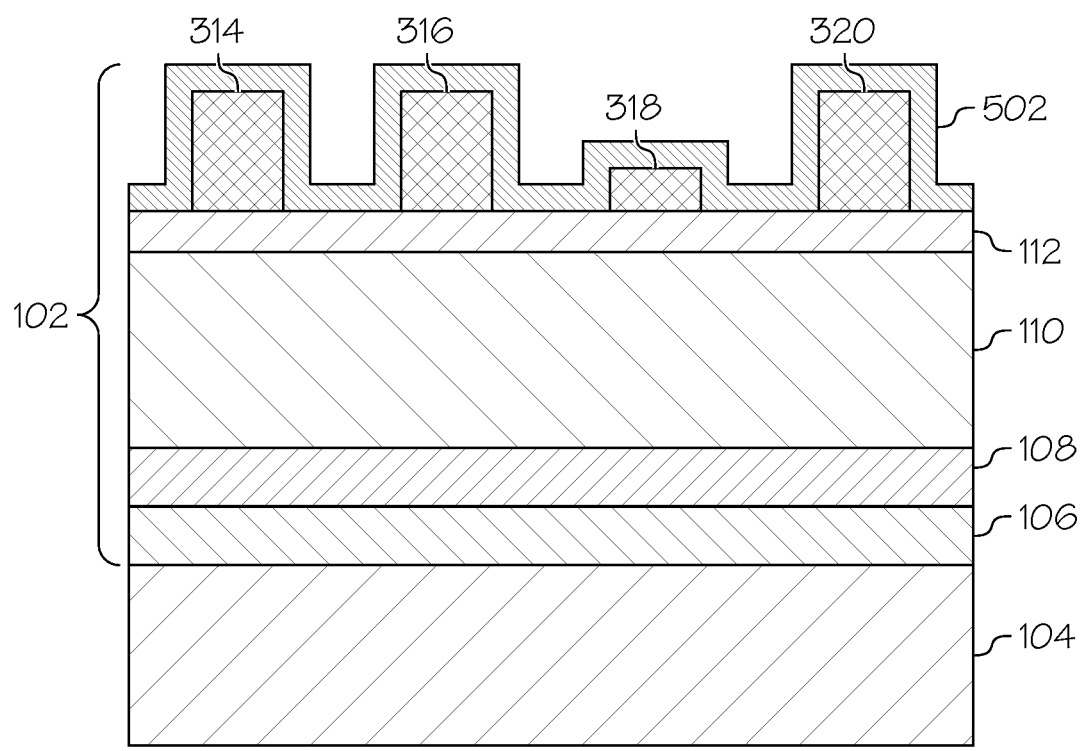
FIG. 5 is a cross-sectional view of the photolithographic patterning stack after a germanium oxide layer has been formed over the patterned photoresist layer and the top most layer of the underlying stack according to one embodiment of the present invention.

One problem with typical descumming processes is that the patterned resist layer 202 may be partially eroded away as the residual resist material is removed from the trenches. This reduces the overall thickness of the patterned resist layer 202, as illustrated in FIG. 4 by the dashed lines. One or more embodiments overcome this problem by forming a conformal layer of germanium oxide (GeOx) 502 over the structure, as shown in FIG. 5. The GeOx layer 502 may be formed in contact with exposed portions of the SiGe layer 112; sidewalls of the patterned resist lines 314 to 320; and a top surface of the patterned resist lines 314 to 320. The GeOx layer 502 may be a conformal layer and formed using a process such as atomic layer deposition (ALD).

Figure 6:
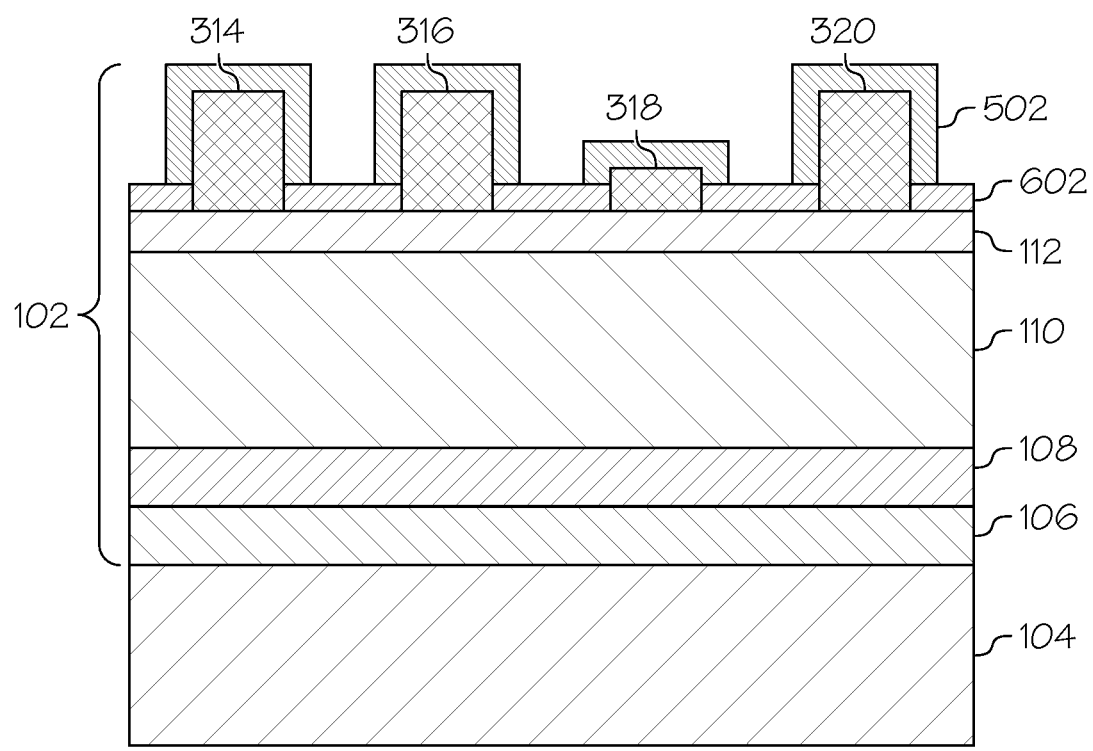
FIG. 6 is a cross-sectional view of the photolithographic patterning stack after silicon oxide layers have been formed in contact with a silicon germanium layer of the stack from utilizing the germanium oxide layer according to one embodiment of the present invention.
Figure 7:
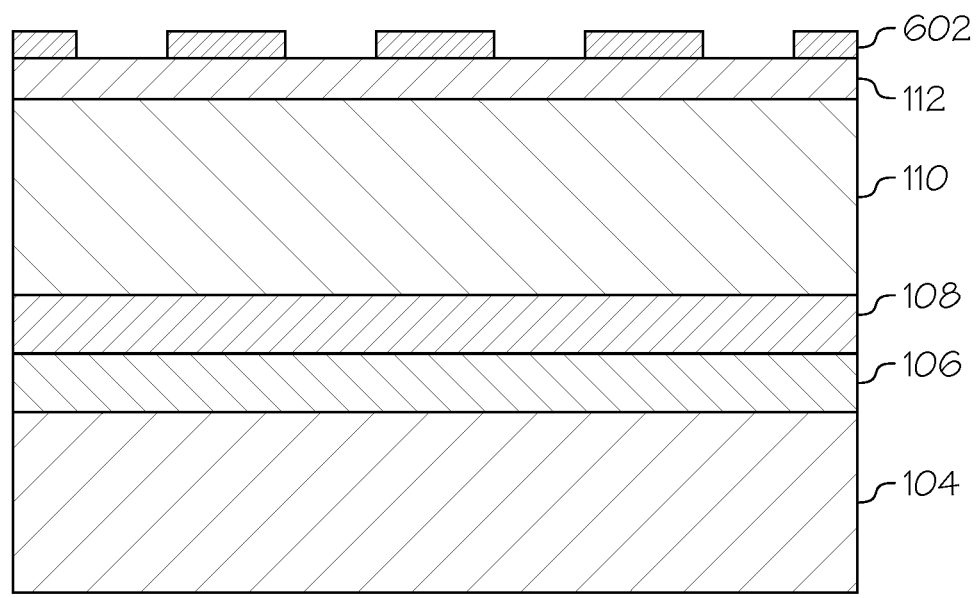
FIG. 7 is a cross-sectional view of the photolithographic patterning stack after unreacted germanium oxide that the patterned photoresist layers have been removed according to one embodiment of the present invention.

An annealing process may be performed to form uniform SiO2 hardmask layers 602 on top of the exposed portions of the SiGe layer 112, as shown in FIG. 6. The SiO2 hardmask layers 602 may have a thickness of, for example, 5-10 nm (although other thickness are applicable as well). The annealing process may be carried out in, for example, vacuum or inert atmospheres (e.g., N2) at a temperature from about 28 C to about 400 C for approximately millisecond to 5 min (although other temperatures and durations may be applicable as well). Only the GeOx in contact with the SiGe layer 112 is converted to SiO2. Stated differently, the anneal results in the following reaction between the GeOx 502 and SiGe layer 112: Si+Ge+2GeO2→4 Ge (condensed)+2GeO (volatile species)+SiO2 (oxide). In other words, the SiO2 602 is selectively formed on the exposed SiGe surfaces, i.e., the portions of the GeOx layer 502 in contact with the exposed portions of the SiGe layer 112 are transformed into SiO2 layers 602. It should be noted that the underlying OPL/aC layer 110 is able to withstand the annealing temperatures After the SiO2 layers 602 have been formed, the unreacted portions of the GeOx layer 502 are removed from the device as shown in FIG. 7. In one embodiment, the unreacted portions of the GeOx layer 502 may be etched/washed away using deionized water. The resist lines 314 to 320 may also be removed by, for example, a plasma (e.g., N2/H2) etching process. The uniform SiO2 layers 602 may be utilized as the mask layer to pattern the SiGe layer 112. One advantage of the SiO2 layer 602 being uniform and used as a masking layer is that the SiGe layer 112 and OPL 110 may be etched without or negligible consumption of the SiO2 layer 602.

Figure 8:
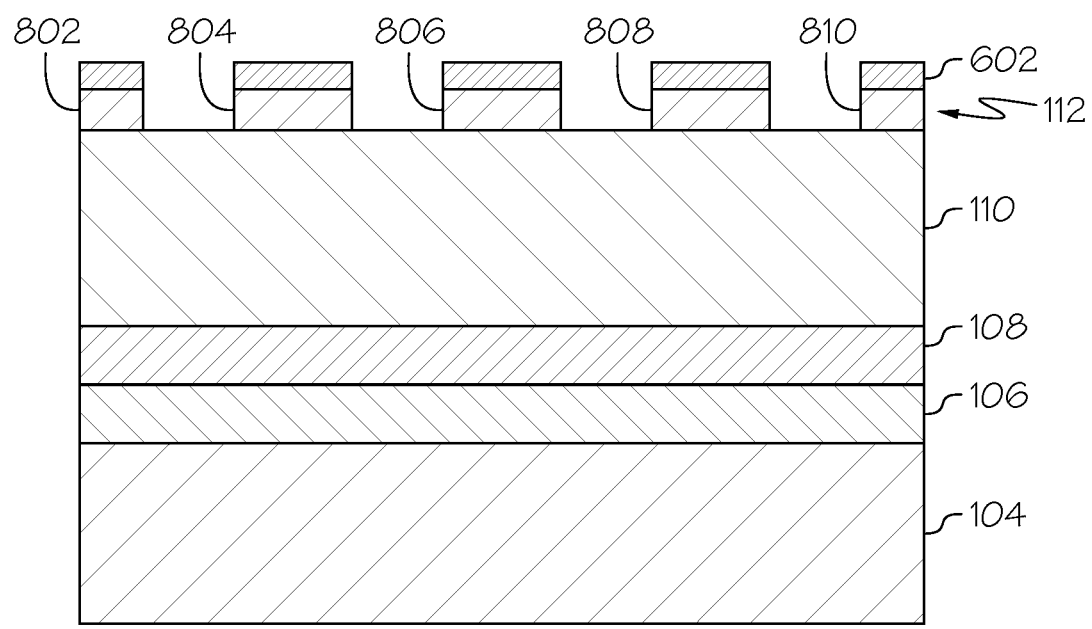
FIG. 8 is a cross-sectional view of the photolithographic patterning stack after a patterned defined by the silicon oxide layers according to one embodiment of the present invention.
Figure 9:
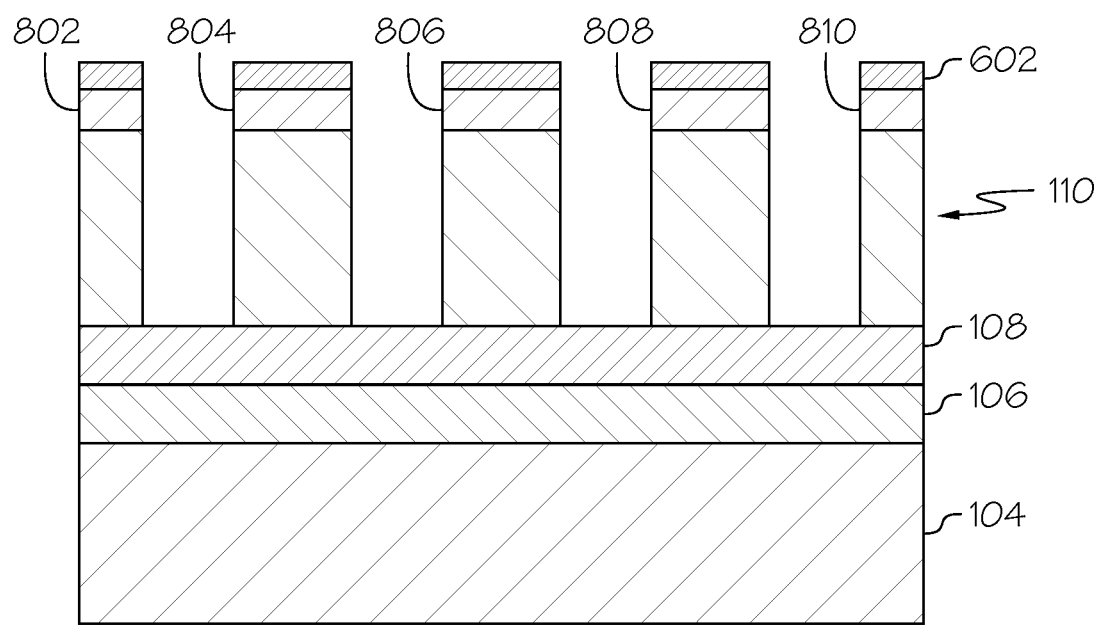
FIG. 9 is a cross-sectional view of the photolithographic patterning stack after the patterned defined by the silicon oxide layers and the patterned silicon germanium layers has been transferred to one or more underlying layers of the stack according to one embodiment of the present invention.

A pattern transferring process is then performed to transfer the pattern defined by the SiO2 layers 602 into the underlying SiGe layer 112. For example, an etching process such as RIE may be performed to remove any exposed portions of the underlying SiGe layer 112 selective to SiO2 to form patterned SiGe lines 802 to 810, as shown in FIG. 8. FIG. 9 shows that the pattern is continued to be transferred down into the next underlying hardmask layer, which in one example is the OPL/aC layer 110. For example, a wet or dry etching process may be used to transfer the pattern into the OPL/aC layer 110 to form pattern OPL/aC lines 902 to 910.

Figure 10:
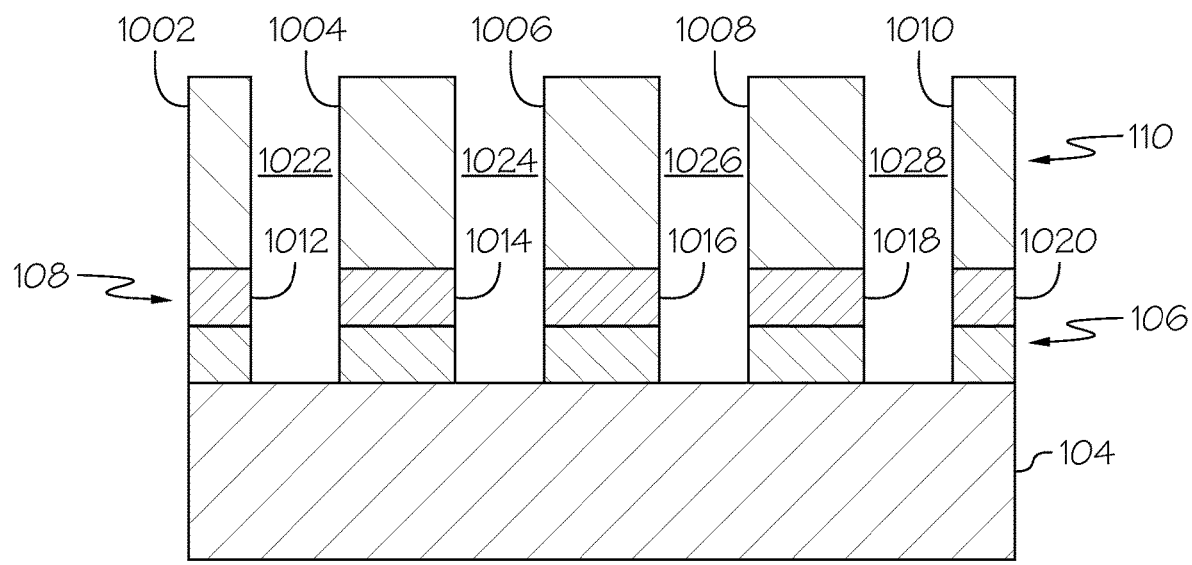
FIG. 10 is a cross-sectional view of the photolithographic patterning stack after the silicon oxide layers and patterned silicon germanium layers have been removed from the stack according to one embodiment of the present invention.

Then, one or more wet or dry etching processes may be used to continue the pattern transfer down to the remaining underlying hardmask layers. For example, FIG. 10 shows that the pattern in FIG. 9 has been transferred to the TEOS based layer 108 and then the TiN layer 106 to form patterned TEOS lines 1002 to 1010 and patterned TiN lines 1012 to 1018, respectively. In the example shown in FIG. 10, the patterning process forms trenches 1022 to 1028 down to the substrate 104 or other layer underlying the patterning stack 102. FIG. 10 also shows that the SiO2 layers 602 and the SiGe layers 112 are consumed during etching of the TEOS and TiN layers. For example, the SiO2 layer 602 are consumed while etching the TEOS layer 108 and the SiGe layers 112 are consumed while etching of the TiN layer 106. One or more features of the semiconductor device may then be formed utilizing the patterned stack 102. The patterned layers of the stack 102 may then be removed utilizing one or more etching processes.

Figure 11:
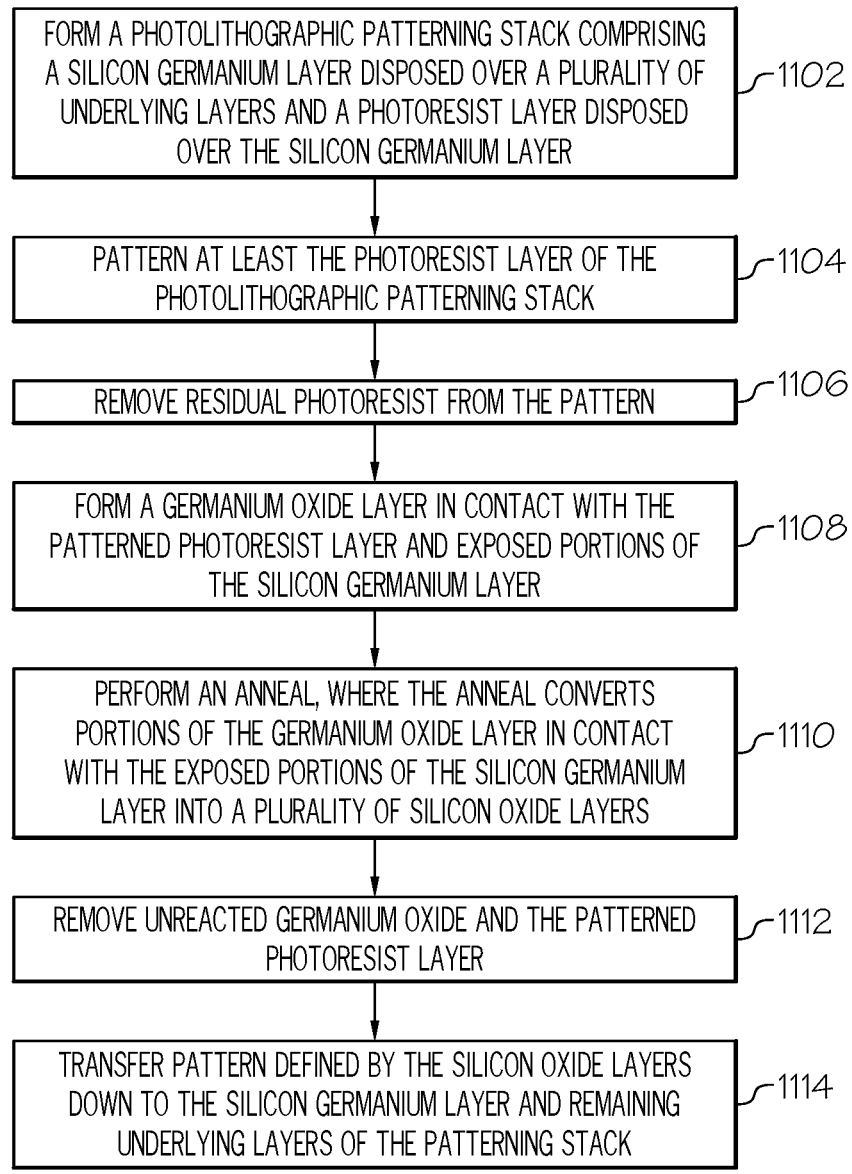
FIG. 11 is an operational flow diagram illustrating one example of a process of an EUV patterning process with resist hardening according to one embodiment of the present invention.

FIG. 11 is an operational flow diagram illustrating one example of an EUV patterning process with resist hardening. It should be noted that each of the steps shown in FIG. 11 has been discussed in greater detail above with respect to FIGS. 1 to 10. A photolithographic patterning stack comprising a silicon germanium layer disposed over a plurality of underlying layers and a photoresist layer disposed over the silicon germanium layer is formed, at step 1102. At least the photoresist layer is patterned, at step 1104. A descumming process is performed to remove residual photoresist from patterned trenches, at step 1106. A germanium oxide layer is formed in contact with the patterned photoresist layer and exposed portions of the silicon germanium layer, at step 1108. An anneal is performed to convert portions of the germanium oxide layer in contact with the exposed portions of the silicon germanium layer into a plurality of silicon oxide layers, at step 1110. Unreacted germanium oxide and the patterned photoresist layer are removed, at step 1112. The pattern defined by the silicon oxide layers/lines is then transferred down to the silicon germanium layer and the remaining underlying layers, at step 1114.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method of forming a photolithographic patterning structure, the method comprising:
   patterning at least a photoresist layer of a photolithographic patterning stack, the patterning exposing portions of a silicon germanium layer of the photolithographic patterning stack;
   forming a germanium oxide layer in contact with the patterned photoresist layer and the portions of the silicon germanium layer; and
   forming, from the germanium oxide layer, a plurality of silicon oxide layers each in contact with one of the portions of the silicon germanium layer.

2. The method of claim 1, wherein forming the plurality of silicon oxide layers comprises:
   performing an anneal, wherein the anneal converts portions of the germanium oxide layer in contact with the portions of the silicon germanium layer into the plurality of silicon oxide layers.

3. The method of claim 1, further comprising:
   removing photoresist residue after the patterning of the photoresist layer, wherein the germanium oxide layer is formed after the photoresist residue has been removed.

4. The method of claim 1, further comprising:
   removing remaining portions of the germanium oxide layer after the plurality of silicon oxide layers has been formed; and
   removing the patterned photoresist layer.

5. The method of claim 4, further comprising:
   transferring a pattern defined by the plurality of silicon oxide layers to the silicon germanium layer, the transferring forming a plurality of patterned silicon germanium lines; and
   transferring a pattern defined by the plurality of patterned silicon germanium lines to one or more underlying layers of the photolithographic patterning stack.

6. The method of claim 1, wherein patterning at least the photoresist layer comprises utilizing an Extreme Ultraviolet lithography process.

7. The method of claim 1, further comprising
   forming a titanium nitride layer of the photolithographic patterning stack over a substrate;
   forming a tetraethyl orthosilicate based layer of the photolithographic patterning stack on and in contact with the titanium nitride layer;
   forming one of an organic planarization layer or amorphous carbon layer of the photolithographic patterning stack on and in contact with the tetraethyl orthosilicate based layer; and
   forming the silicon germanium layer on and in contact with the one of an organic planarization layer or amorphous carbon layer.

* * * * *